United States Patent [19]
Kimura

[11] Patent Number: 5,189,680
[45] Date of Patent: Feb. 23, 1993

[54] VISIBLE LIGHT LASER DIODE

[75] Inventor: Tatsuya Kimura, Itami, Japan

[73] Assignee: Mitsubishi Denki Kabushiki Kaisha, Tokyo, Japan

[21] Appl. No.: 754,658

[22] Filed: Sep. 4, 1991

[30] Foreign Application Priority Data

Apr. 16, 1991 [JP] Japan .................. 3-112543

[51] Int. Cl.⁵ .................. H01S 3/19
[52] U.S. Cl. .................. 372/46; 372/45
[58] Field of Search .................. 372/46, 45

[56] References Cited

U.S. PATENT DOCUMENTS

| | | | |
|---|---|---|---|
| 4,893,313 | 1/1990 | Hatakoshi et al. | 372/46 |
| 4,959,839 | 9/1990 | Yamamoto | 372/46 |
| 4,961,197 | 10/1990 | Tanaka et al. | 372/46 |

FOREIGN PATENT DOCUMENTS

| | | |
|---|---|---|
| 0328134 | 8/1989 | European Pat. Off. |
| 1-202880 | 8/1989 | Japan |
| 2-156522 | 6/1990 | Japan |
| 2-254715 | 10/1990 | Japan |

OTHER PUBLICATIONS

Fujii et al, "Suppression of Be Diffusion in Molecular-Beam Epitaxy AlGaAs by the Incorporation of In for Heterojunction Bipolar Transistor Application", Journal of Vacuum Science Technology, vol. B8, No. 2, 1990, pp. 154-156.
Boermans et al, "Investigation of Te and Tm Polarized Laser Emission in GaInP/AlGaInP Laser by Growth-Controlled Strain", Electronics Letters, vol. 26, No. 16, Aug. 1990, pp. 1438-1439.
Hashimoto et al, "Effects of Strained-Layer Structures on the Threshold Current Density of AlGaInP/GaInP Visible Lasers", Applied Physics Letters, vol. 58, No. 9, Mar. 1991, pp. 879-880.
Bour et al, "Organometallic Vapor Phase Epitaxial Growth of $(Al_xGa_{1-x})_{0.5}In_{0.5}P$ and Its Heterostructures", IEEE Journal of Quantum Electronics, vol. 24, No. 9, Sep. 1988, pp. 1856-1863.

Primary Examiner—Georgia Y. Epps
Attorney, Agent, or Firm—Leydig, Voit & Mayer

[57] ABSTRACT

A laser diode producing visible light includes GaInP, AlGaInP system layers and an undoped GaInP active layer, successively grown on a GaAs substrate in a first growth step, a stripe-shaped mesa formed by etching portions of the layers, and GaInP, AlGaInP system layers grown in subsequent growth steps. At least one of the layers formed in the first growth step has a lattice mismatch in a range of $2 \times 10^{-3} \sim 1 \times 10^{-2}$ or $-5 \times 10^{-3} \sim -2 \times 10^{-2}$ relative to the GaAs substrate. Therefore, a crystalline distortion is produced in layers other than the active layer and the diffusion of zinc into the undoped GaInP active layer is suppressed. As a result, a laser diode having improved characteristics is obtained.

7 Claims, 6 Drawing Sheets

VISIBLE LIGHT LASER DIODE

FIELD OF THE INVENTION

The present invention relates to a laser diode producing light visible to the naked eye and, more particularly, to a laser diode that suppresses accumulation of zinc in an undoped GaInP active layer which at an interface between a p type layer and the undoped GaInP active layer.

BACKGROUND OF THE INVENTION

FIG. 7 is a cross-sectional view showing the structure of a prior art visible laser diode. In FIG. 7, an n type GaAs buffer layer 12 is disposed on an n type GaAs substrate 11. An n type AlGaInP cladding layer 13 is disposed on the n type GaAs buffer layer 12. An undoped GaInP active layer 14 is disposed on the n type AlGaInP cladding layer 13. A p type AlGaInP waveguide layer 15 is disposed on the undoped GaInP active layer 14. A p type GaInP etch stopping layer 16 is disposed on the p type AlGaInP waveguide layer 15. A p type AlGaInP cladding layer 17 is disposed on the p type GaInP etch stopping layer 16. A p type GaInP layer 18 is disposed on the p type AlGaInP cladding layer 17. A p type GaAs contact layer 20 is disposed on the p type GaInP layer 18. A forward mesa stripe is formed of the p type AlGaInP cladding layer 17, p type GaInP layer 18 and a part of p type GaAs contact layer 20. An n type GaAs current blocking layer 19 is disposed on the p type GaInP etch stopping layer 16 to bury the forward mesa stripe.

A description is given of the production process.

First of all, an n type GaAs buffer layer 12, an n type AlGaInP cladding layer 13, an undoped GaInP active layer 14, a p type AlGaInP waveguide layer 15, a p type GaInP etch stopping layer 16, a p type AlGaInP cladding layer 17, a p type GaInP layer 18 and a p type GaAs cap layer 20a are successively grown on an n type GaAs substrate 11 by MOCVD (first crystal growth). Subsequently, a stripe pattern is formed using ordinary photolithography techniques and the p type GaAs cap layer 20a, p type GaInP layer 18 and p type AlGaInP cladding layer 17 are etched using the stripe pattern as a mask to form a mesa. Thereafter, an n type GaAs current blocking layer 19 is grown by MOCVD in the groove formed by the etching (second crystal growth), and a p type GaAs contact layer 20 as a top layer is grown by MOCVD (third crystal growth). Here, the p type GaAs cap layer 20a is fused into one with the p type GaAs contact layer 20 during the third growth, as shown by the dotted line in the p type GaAs contact layer 20 in FIG. 7.

In the laser diode as shown in FIG. 7, it is thought important to make the substrate and the epitaxial layer lattice-match with each other in order to suppress the crystalline defects and the deterioration of surface morphology, so that the lattice constant of the GaAs substrate coincide with the lattice constants of the GaInP and AlGaInP system layers as much as possible. In order to produce an improved laser diode, it is thought ideal to make the ratio between the lattice constant of the GaAs substrate and that of the (Al)GaInP layer, i.e., the lattice mismatch ($\Delta a/a$) (here, a is lattice constant of GaAs, and $\Delta a$ is difference between the lattice constant of GaAs and that of the AlGaInP layer) approach to zero as shown in FIG. 8 and, further, it is thought necessary to adjust the lattice mismatch within ±0.001.

Therefore, a lot of proposals are offered to make the lattice constants of the GaAs substrate and the (Al)-GaInP layer coincide with each other as much as possible to lower the lattice mismatch. For example, in Japanese Published Patent Application No. 1-202880, a laser diode, in which the lattice mismatch of the n type cladding layer is previously shifted to the plus side ($\Delta a/a$: 0.0005 to 0.001) thereby to reduce the lattice mismatch in the p type cladding layer, is disclosed. On the other hand, Japanese Published Patent Application No. 2-156522 discloses that an AlGaInP layer having good crystal quality is obtained by varying the growth temperature or the constitution ratio (V/III ratio) of the elements supplied at the start of the production of GaInP buffer layer rather than at the conclusion of the production thereof while producing an AlGaInP/GaAs system multi-layer semiconductor laser on a GaAs substrate. Further, Japanese Published Patent Application No. 2-254715 discloses that the lattice constant of the AlGaInP system layers are made coincide with the lattice constant of a GaAs buffer layer by differentiating the growth temperatures of the layers.

The prior art laser diode shown in FIG. 7 is produced through three crystal growth processes comprising a first growth before producing a mesa, a second growth after producing the mesa, and a third growth for producing a contact layer. FIGS. 9(a) and 9(b) show profiles of Zn as p type dopant in respective layers measured by secondary ion mass spectroscopy (hereinafter referred to a SIMS) in the prior art laser diode shown in FIG. 7. More specifically, FIG. 9(a) shows a profile of Zn from SIMS measurements at the conclusion of the first growth and FIG. 9(b) shows a profile of Zn from SIMS measurements at the conclusion of the third growth. In these figures, the profile of Zn falls steeply at the interface between the undoped GaInP active layer 14 and the p type AlGaInP waveguide layer 15 after the first growth while Zn accumulates at the interface between the undoped GaInP active layer 14 and the p type AlGaInP waveguide layer 15 after the third growth. In this way, the prior art laser diode is produced through a plurality of crystal growth processes and even when diffusion of a dopant impurity into the active layer is not seen after the first growth, the impurity sometimes diffuses into the active layer by such influences as substrate heating during crystal growth in the second and third growth steps. Especially, Zn as p type dopant is abnormally accumulated at the interface between the p type layer and the undoped GaInP active layer and significantly adversely affects lasers characteristics.

SUMMARY OF THE INVENTION

The present invention is directed to solving the above-described problems and has for its object to provide a laser diode producing visible light that suppresses the diffusion of Zn into the undoped GaInP active layer and thus prevents the accumulation of Zn at the interface between the p type layer and the undoped GaInP active layer.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, at the time of the first crystal growth for successively growing GaInP and AlGaInP system layers on the GaAs substrate, at least one layer is grown such that its lattice mismatch ($\Delta a/a$) with GaAs is in a range of $2 \times 10^{-3} \sim 1 \times 10^{-2}$ or $-5 \times 10^{-3} \sim -2 \times 10^{-3}$ and, thereafter, the subsequent crystal growth steps are carried out, thereby producing a laser diode producing visible light.

Therefore, the lattice constants of the GaInP, AlGaInP system layers formed on the GaAs substrate are made appropriately larger than (or smaller than) the lattice constant of GaAs, so that the crystalline distortion does not induce considerable crystalline defects, whereby Zn is subjected to pressure and diffusion of Zn into the undoped GaInP active layer is suppressed.

DETAILED DESCRIPTION OF THE PREFERRED EMBODIMENTS

An embodiment of the present invention will be described in detail with reference to the drawings.

Figure 1A:
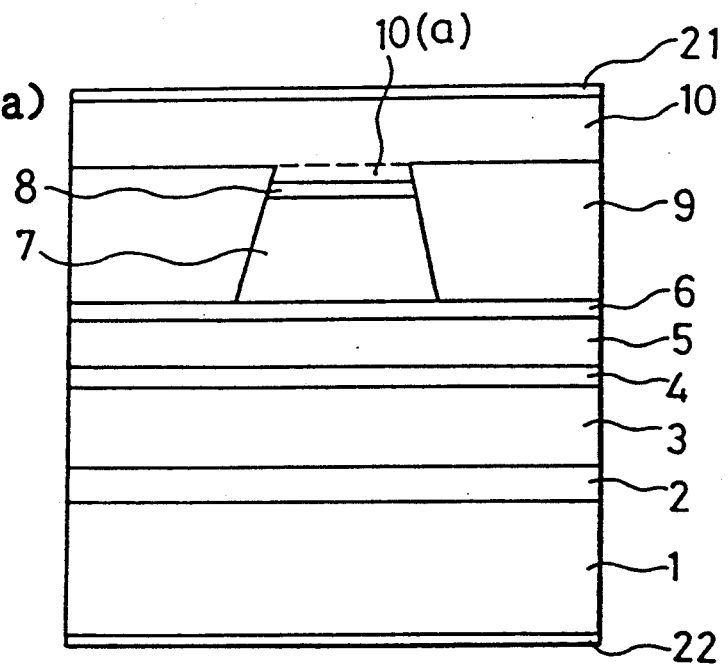
FIGS. 1(a) and 1(b) are a cross-sectional view and a perspective view showing a laser diode in accordance with a first embodiment of the present invention.
Figure 1B:
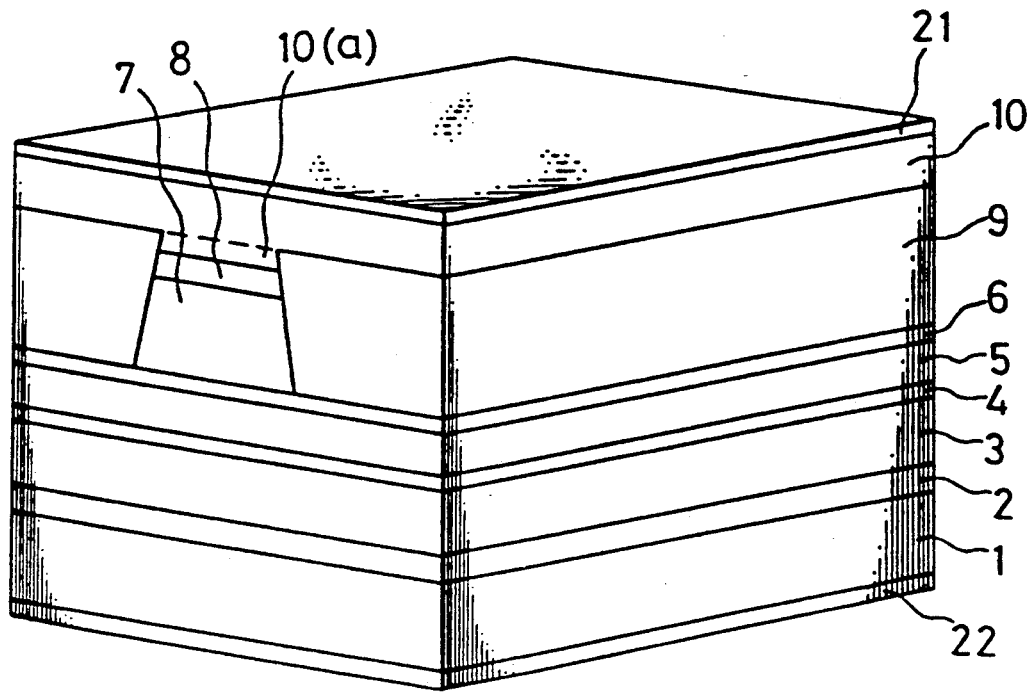

FIGS. 1(a) and 1(b) are a cross-sectional view and a perspective view showing a laser diode in accordance with a first embodiment of the present invention.

In FIGS. 1(a) and 1(b) an n type GaAs buffer layer 2 is disposed on the GaAs substrate 1. An n type AlGaInP cladding layer 3 is disposed on the n type GaAs buffer layer 2. An undoped GaInP active layer 4 is disposed on the n type AlGaInP cladding layer 3. A p type AlGaInP waveguide layer 5 is disposed on the undoped GaInP active layer 4. A p type GaInP etch stopping layer 6 is disposed on the p type AlGaInP waveguide layer 5. A p type AlGaInP cladding layer 7 is disposed on the p type GaInP etch stopping layer 6. A p type GaInP layer 8 is disposed on the p type AlGaInP cladding layer 7. A p type GaAs contact layer 10 is disposed on the p type GaInP layer 8. A forward mesa stripe is formed of the p type AlGaInP cladding layer 7, p type GaInP layer 8 and a part of GaAs contact layer 10. An n type GaAs current blocking layer 9 is disposed on the etch stopping layer 6 burying the forward mesa stripe.

A description is given of the production method of the semiconductor laser.

First of all, trimethylindium (TMI) as a source of In, triethylgallium (TEG) as a source of Ga, trimethylaluminium (TMA) as a source of Al, arsine (AsH$_3$) as a source of As, diethylzinc as a source of Zn (p type dopant) and silane (SiH$_4$) as a source of Si (n type dopant) are introduced into a reactor and the constitution ratio (supply amount ratio) of each gas is controlled as shown in Table 1 while growing layers for a laser diode by MOCVD. The growth temperature is 675° C. and the pressure in the reactor is 150 Torr. More specifically, an n type GaAs buffer layer 2 of 0.5 micron thickness, an n type AlGaInP cladding layer 3 of 1.0 micron thickness, an undoped GaInP active layer 4 of 0.07 micron thickness, a p type AlGaInP waveguide layer 5 of 0.25 micron thickness, a p type GaInP etch stopping layer 6 of 50 angstroms thickness, a p type AlGaInP cladding layer 7 of 0.7 micron thickness, a p type GaInP layer 8 of 0.1 micron thickness and a p type GaAs cap layer 10a of 0.4 micron thickness are successively grown on a GaAs substrate 1 (first crystal growth).

Table 1 shows the relationship between the composition of each layer and the material sources at the growth of the layers in comparison with the prior art.

TABLE 1

| crystal | supply amount of material gas (cc/min) | | | | | | |
|---|---|---|---|---|---|---|---|
| | TMA | TEG | TMI | DEZ | PH$_3$ | AsH$_3$ | SiH$_4$ |
| present invention | | | | | | | |
| n-AlGaInP | 15 | 150 | 330 | — | 200 | — | 15 |
| p-AlGaInP | 15 | 150 | 330 | 100 | 200 | — | — |
| p-GaInP | — | 450 | 330 | 200 | 600 | — | — |
| un-GaInP | — | 520 | 330 | — | 600 | — | — |
| GaAs | — | 1350 | — | — | — | 450 | — |
| prior art | | | | | | | |
| n-AlGaInP | 15 | 150 | 330 | — | 200 | — | 15 |
| p-AlGaInP | 16 | 165 | 330 | 100 | 200 | — | — |
| p-GaInP | — | 470 | 330 | 200 | 600 | — | — |
| un-GaInP | — | 520 | 330 | — | 600 | — | — |
| GaAs | — | 1350 | — | — | — | 450 | — |

As shown in table 1, the amount of TMA and TMI is reduced and the proportion of DEZ as a p type dopant gas to the total introduced gas is increased thereby to increase the lattice constant of the p type AlGaInP layer. The amount of TEG gas is reduced to increase the lattice constant of the p type GaInP layer.

Next, a dielectric film comprising such as SiO$_2$ is formed on the p type GaAs cap layer 10a and the dielectric film is patterned in a stripe configuration by photolithography and etching. Then, the p type GaAs cap layer 10a, p type GaInP layer 8, and AlGaInP cladding layer 7 are etched using the stripe-shaped pattern as a mask to form a mesa stripe. Then, an n type GaAs current blocking layer 9 is grown in the groove formed by the etching. This selective crystal growth is carried out using the stripe-shaped pattern as a mask by MOCVD at a growth temperature of 700° C. and a pressure in the reactor of 76 Torr (second crystal growth). After removing the stripe-shaped pattern, a p type GaAs contact layer 10 of 3.0 micron thickness as the top layer is formed by MOCVD at a growth temperature of 600° C. and a pressure in the reactor of 76 Torr (third crystal growth). Thereafter, a p side electrode 21 is produced on the p type GaAs contact layer 10 and an n side electrode 22 is formed on the rear surface of the GaAs substrate 1. Here, the p type GaAs cap layer 10a is fused into one with the p type GaAs contact layer 10 as shown by the dotted line in the p type GaAs contact layer 10 in FIG. 1.

Figure 3:
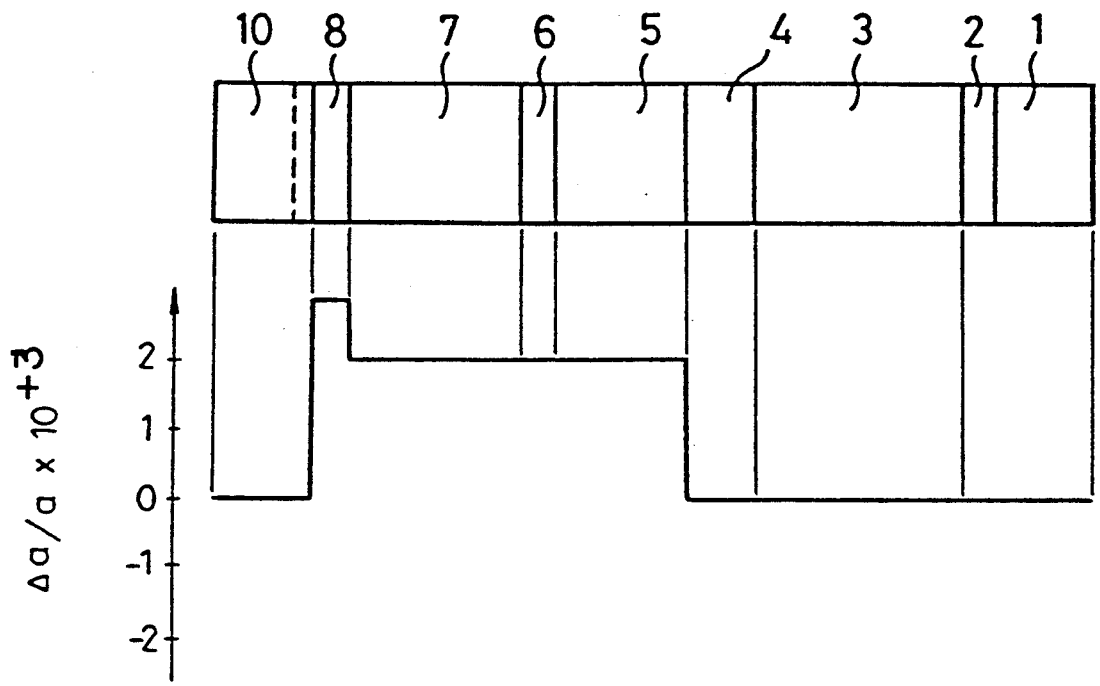
FIG. 3 is a diagram showing lattice mismatch of respective layers of a laser diode in accordance with the first embodiment of the present invention.
Figure 4:
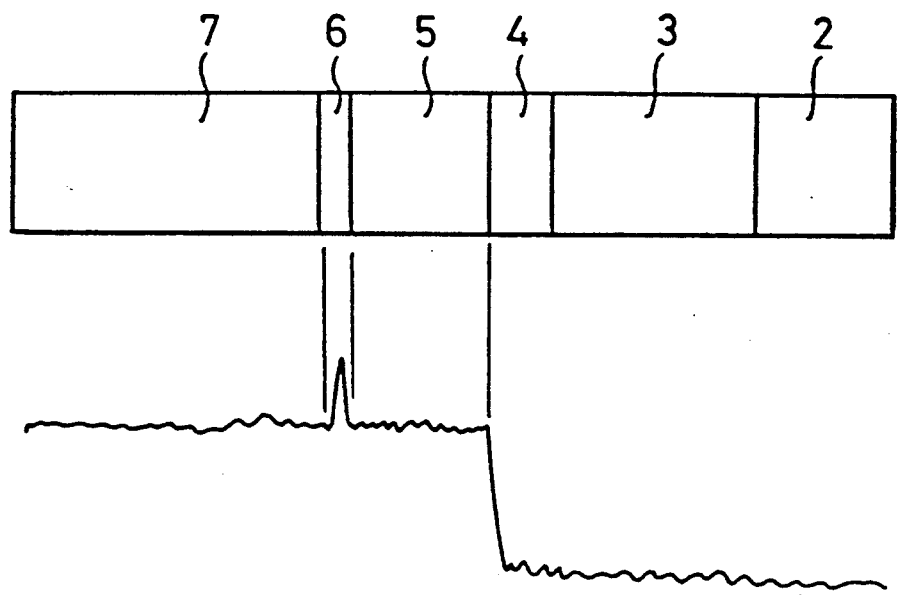
FIG. 4 is a diagram showing a Zn profile measured by SIMS for the respective layers of a laser diode in accordance with the first embodiment of the present invention.

In the light semiconductor layer thus obtained, the lattice mismatch ($\Delta a/a$) relative to the substrate 1 is shown in FIG. 3, and the Zn profile measured by SIMS for the respective layers is shown in FIG. 4.

It is apparent from FIGS. 3 and 4 that the p type AlGaInP waveguide layer 5, p type GaInP layer 6 and p type AlGaInP layer 7 show lattice mismatch ($\Delta a/a$) relative to the substrate of about $2.0 \times 10^{-3}$, the p type GaInP layer 8 shows lattice mismatch ($\Delta a/a$) relative to the substrate of about $2.8 \times 10^{-3}$, and a crystalline distortion is generated in the crystal, whereby the diffusion of Zn into the undoped GaInP active layer 4 is suppressed.

In the laser diode according to this embodiment, the p type AlGaInP waveguide layer 5, p type GaInP layer 6 and p type AlGaInP layer 7 grown by the first crystal growth show lattice mismatch ($\Delta a/a$) relative to the substrate of about $2.0 \times 10^{-3}$, and the p type GaInP layer 8 shows lattice mismatch ($\Delta a/a$) relative to the substrate of about $2.8 \times 10^{-3}$. Therefore, stress is applied to Zn by the crystalline distortion, and even when the subsequent crystalline growths are carried out, Zn does not diffuse into the undoped GaInP active layer 4 whereby an accumulation of Zn at the interface between the p type AlGaInP waveguide layer 5 and the undoped GaInP active layer 4 is suppressed.

Figure 2A:
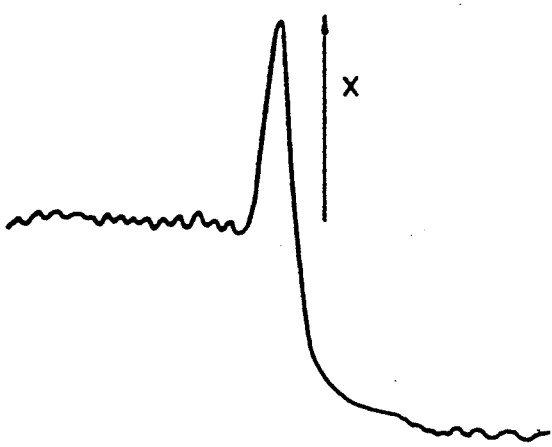
FIG. 2(a) and 2(b) is a diagram showing the relation between intensity (x) of Zn profile and lattice mismatch ($\Delta a/a$) as measured by SIMS in a laser in accordance with the first embodiment of the present invention.
Figure 2B:
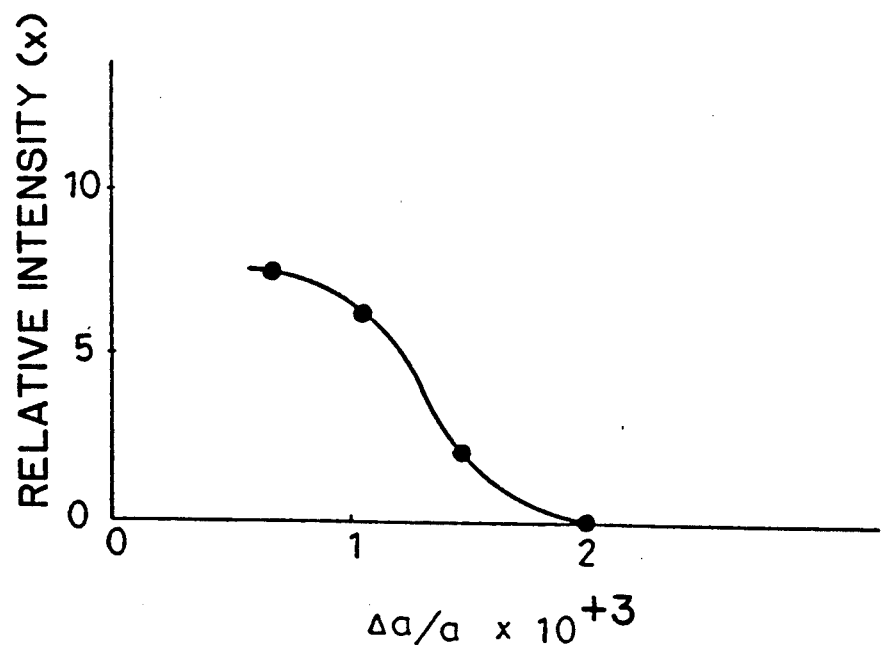

FIGS. 2(a) and 2(b) show the relationship between the relative intensity (x) of the SIMS Zn profile at the interface between the GaInP active layer and the p type AlGaInP layer and the lattice mismatch (here, a positive value) between the GaAs layer and the p type AlGaInP crystal layer. As is apparent from FIG. 2(b), the relative intensity (x) rapidly falls when the lattice mismatch ($\Delta a/a$) exceeds $1 \times 10^{-3}$, and when the lattice mismatch is $2 \times 10^{-3}$ or more, the relative intensity (x) is almost zero. That is, when the lattice mismatch ($\Delta a/a$) is $2 \times 10^{-3}$ or more, crystalline distortion suppresses the diffusion of Zn into the undoped GaInP active layer.

On the other hand, when the crystal distortion in the crystal is too large so that the lattice mismatch is larger than $1.0 \times 10^{-2}$ or smaller than $-5 \times 10^{-3}$, although the accumulation of Zn is suppressed, the surface morphology deteriorates and there arises so-called cross-hatching, adversely affecting laser characteristics. Therefore, it is important to adjust the lattice mismatch in a range of $2 \times 10^{-3} \sim 1 \times 10^{-2}$ or $-5 \times 10^{-3} \sim -2 \times 10^{-3}$ in order to obtain a visible light laser diode that suppresses the accumulation of Zn in the undoped GaInP active layer, reduces the influence of the crystalline defects, and has reduced adverse effect on laser characteristics.

Since the crystalline distortion sufficient for applying stress to Zn is not generated when the lattice mismatch is in a range of $-2 \times 10^{-3} \sim 2 \times 10^{-3}$, an accumulation of Zn in the undoped GaInP active layer occurs and the laser characteristic are adversely affected.

A second embodiment of the present invention will be described hereinafter. The fundamental layer construction of the visible light laser diode according to the second embodiment is the same as that of the first embodiment shown in FIG. 1(a). In this second embodiment, in the first crystal growth process by MOCVD, the supply amounts of respective of TMI, TEG, TMA, PH$_3$, As, DEZ, SiH$_4$ are controlled as shown in Table 2. That is, as a general tendency, when the relative proportion of TMI gas is increased, the lattice constant increases and then the lattice mismatch ($\Delta a/a$) also increases. Further, when the relative proportions of TEG gas and TMA gas are increased, the lattice constant decreases and then the lattice mismatch ($\Delta a/a$) also decreases. In this second embodiment, the proportion of each gas is controlled as shown in Table 2 and the other growth conditions are the same as those of the first embodiment. A laser diode is produced by successively conducting the first growth, the second growth after forming the mesa, and the third growth, similarly as in the first embodiment.

TABLE 2

| crystal layer | supply amount of material gas (cc/min) | | | | | | |
|---|---|---|---|---|---|---|---|
| | TMA | TEG | TMI | DEZ | PH$_3$ | AsH$_3$ | SiH$_4$ |
| n-GaAs (2) | — | 1350 | — | — | — | 450 | 100 |
| n-AlGaInP (3) | 15 | 150 | 330 | — | 200 | — | 15 |
| un-GaInP (4) | — | 520 | 330 | — | 600 | — | — |
| p-AlGaInP (5) | 15 | 150 | 330 | 70 | 200 | — | — |
| p-GaInP (6) | — | 470 | 330 | 100 | 600 | — | — |
| p-AlGaInP (7) | 16 | 165 | 330 | 100 | 200 | — | — |
| p-GaInP (8) | — | 470 | 330 | 200 | 600 | — | — |
| p-GaAs (9) | — | 1350 | — | 200 | — | 450 | — |

Figure 5:
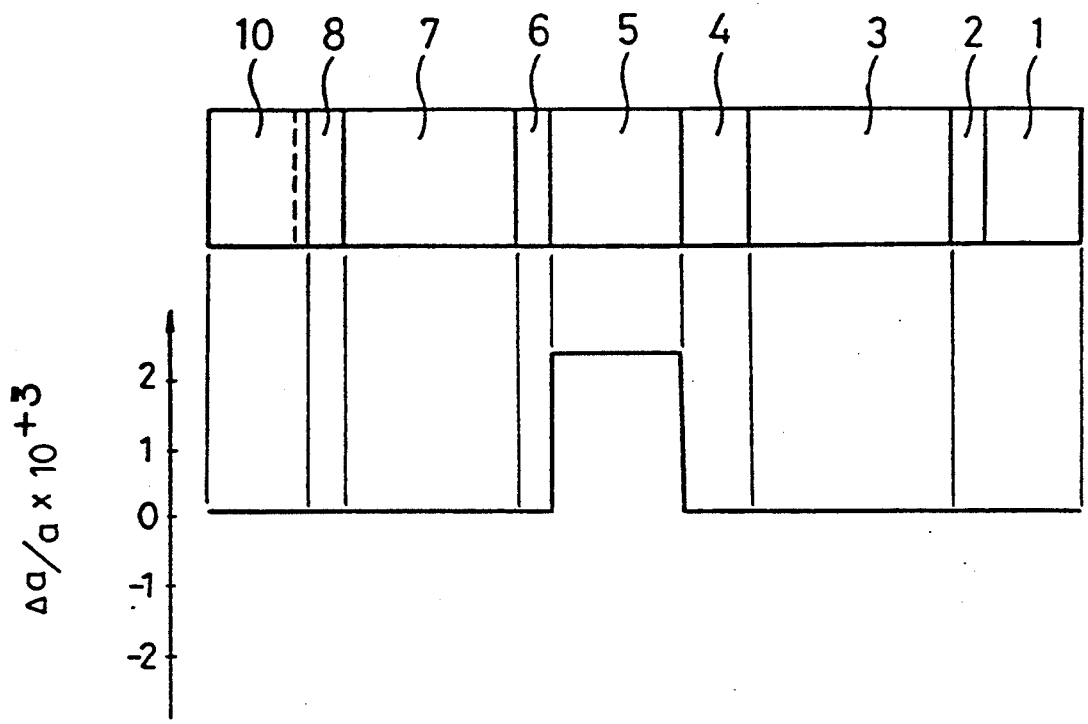
FIG. 5 is a diagram showing lattice mismatch of respective layers of a laser diode in accordance with a second embodiment of the present invention.

In this second embodiment, during the first crystal growth, the p type AlGaInP waveguide layer 5 shows a lattice mismatch ($\Delta a/a$) relative to the substrate of about $2.2 \times 10^{-3}$ as shown in FIG. 5, and the crystalline distortion is generated in the p type AlGaInP waveguide layer 5, whereby the diffusion of Zn into the undoped GaInP active layer 4 is suppressed.

Figure 6:
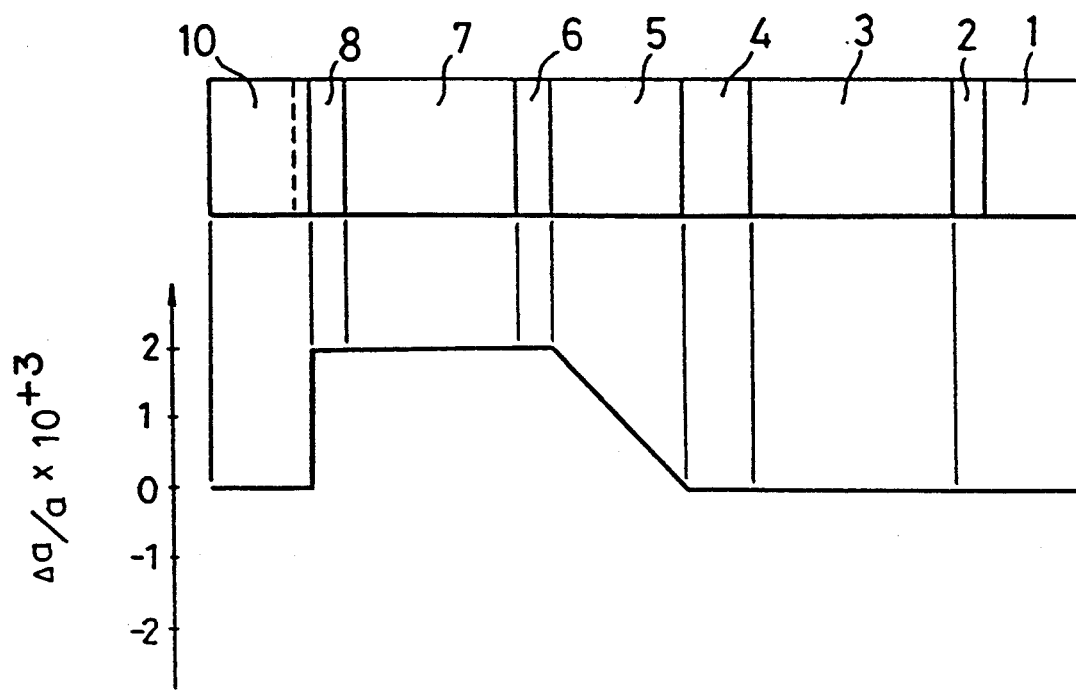
FIG. 6 is a diagram showing lattice mismatch of respective layers of a laser diode in accordance with a third embodiment of the present invention.
Figure 7:
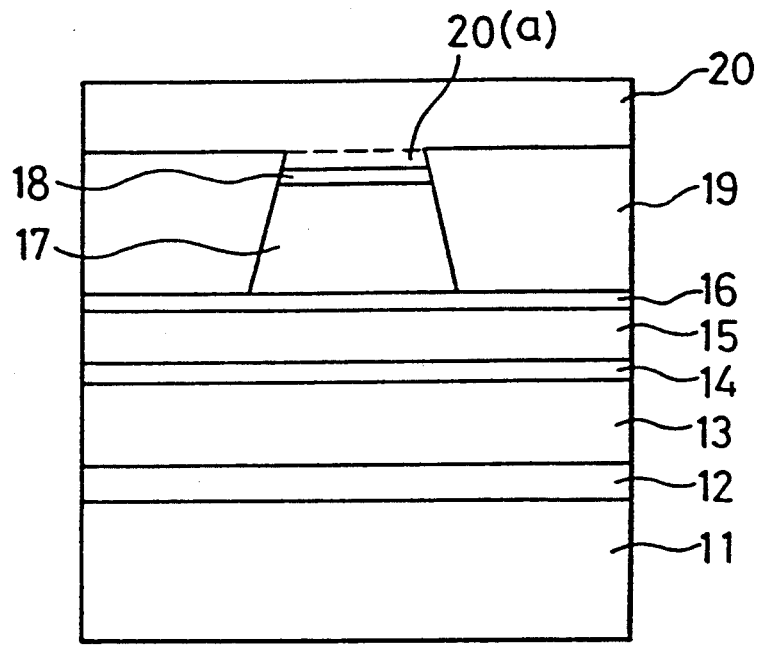
FIG. 7 is a cross-sectional view showing a prior art laser diode.
Figure 8:
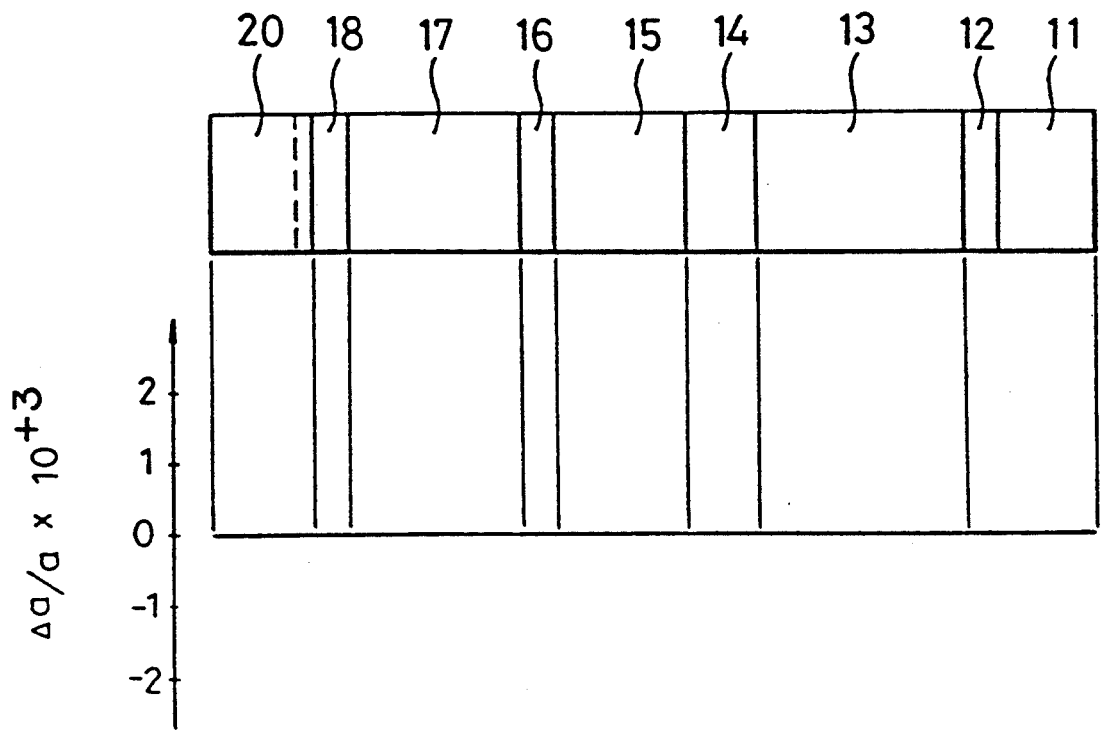
FIG. 8 is a diagram showing lattice mismatch of respective layers of the prior art laser diode.
Figure 9A:
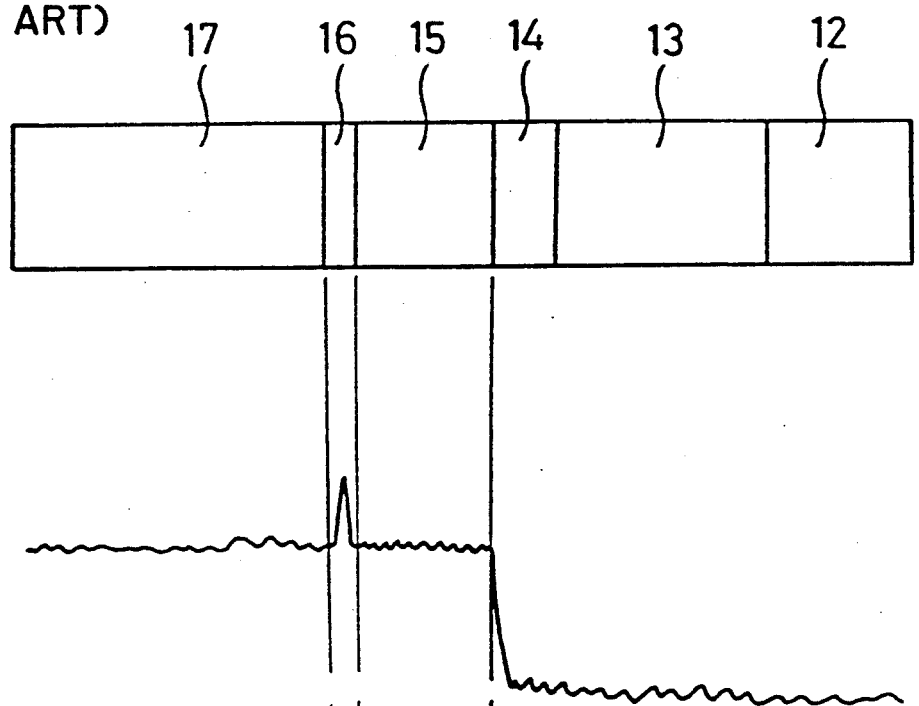
FIGS. 9(a) and 9(b) are diagrams showing Zn profiles measured for the respective layers of the prior art laser diode.
Figure 9B:
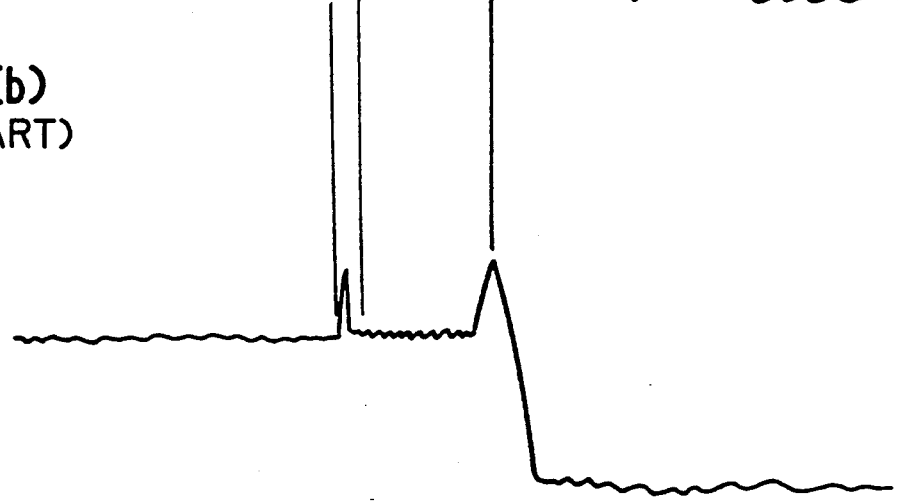

A third embodiment of the present invention will be described hereinafter. The fundamental layer construction of the visible light laser diode according to the third embodiment is the same as that of the first embodiment shown in FIG. 1(a). In this third embodiment, in the first growth process, the GaAs buffer layer 2, AlGaInP cladding layer 3 and GaInP active layer 4 are grown at 700° C. and the growth temperature is lowered to 650° C. with the start of the growth of p type AlGaInP waveguide layer 5. The growth temperature is held at 650° C. until the first growth is completed. Other growth conditions are the same as those of the first embodiment. A laser diode is produced by conducting the second growth and the third growth after the mesa is formed similarly as in the first embodiment. FIG. 6 shows the lattice mismatch ($\Delta a/a$) of the semiconductor laser and it is apparent from FIG. 6 that the lattice mismatch ($\Delta a/a$) relative to the substrate gradually increases in the p type AlGaInP waveguide layer 5 and it is about $2.0 \times 10^{-3}$ in the p type GaInP etch stopping layer 6, p type AlGaInP cladding layer 7 and p type GaInP layer 8.

In the semiconductor laser according to the third embodiment of the present invention, during the first crystal growth, the lattice mismatch ($\Delta a/a$) in the p type AlGaInP waveguide layer 5 gradually increases and the p type GaInP etch stopping layer 6, p type AlGaInP cladding layer 7, and p type GaInP layer 8 show a lattice mismatch ($\Delta a/a$) relative to the substrate of about $2.0 \times 10^{-3}$. Thus, crystalline distortion is generated, whereby diffusion of Zn into the undoped GaInP active layer is suppressed.

Further, in the semiconductor laser of this embodiment, the lattice mismatch ($\Delta a/a$) relative to the substrate of the p type AlGaInP waveguide layer 5 adjacent to the undoped GaInP active layer 4 is small at a portion closest to the undoped GaInP active layer 4 and gradually increases from the active layer 4. Therefore, no large crystalline distortion at the interface between the undoped GaInP active layer 4 and the p type AlGaInP waveguide layer 5 exerts other evil influences.

In the present invention, increasing the proportion of DEZ gas in the supply gas in the first growth process is adopted in the first embodiment, controlling the constitution ratio of TMA, TMI, and TEG in the supply gas in the first growth process is adopted in the second embodiment, and varying the growth temperature in the first growth process is adopted in the third embodiment. These three steps may be combined in the present invention.

According to the present invention, in a visible light laser diode which is obtained by successively growing that GaInP, AlGaInP system layers on a GaAs substrate by a first crystal growth and, thereafter, the subsequent growths are carried out, at least a layer of GaInP, AlGaInP system layers obtained by the first growth is formed so as to have a lattice mismatch relative to the substrate in a range of $2\times 10^{-3} \sim 1 \times 10^{-2}$ or $-5\times 10^{-3} \sim -2\times 10^{-3}$. Therefore, a crystalline distortion is generated in the layers, other than the undoped GaInP active layer, and the diffusion of Zn into the undoped GaInP active layer is suppressed. As a result, a laser diode producing visible light having a reduced deterioration of its characteristics is obtained.

What is claimed is:

1. A semiconductor laser comprising:
   an n-type GaAs substrate having a lattice constant a;
   an n-type AlGaInP first cladding layer having a first lattice constant a;
   an undoped GaInP active layer having a second lattice constant;
   a p-type AlGaInP second cladding layer containing Zn as a dopant impurity and having a third lattice constant;
   a p-type GaAs contacting layer, said layers being serially arranged physically and electrically; and
   a first electrode disposed on the substrate and a second electrode disposed on the contacting layer wherein the first and second lattice constants are substantially equal to a and the ratio of the third lattice to a falls within a range of $2\times 10^{-3}$ to $1\times 10^{-2}$ when the third lattice constant is larger than a and a range of $5\times 10^{-3}$ to $2\times 10^{-2}$ when the third lattice constant is smaller than a, whereby Zn diffusion into the active layer is inhibited.

2. The semiconductor laser of claim 1 including a p-type AlGaInP waveguide layer interposed between the active and second cladding layers and containing Zn as a dopant impurity and having a lattice constant substantially equal to the third lattice constant.

3. The semiconductor laser of claim 2 including a p-type GaInP etch stopping layer interposed between the waveguide and second cladding layers and containing Zn as a dopant impurity and having a lattice constant substantially equal to the third lattice constant.

4. A semiconductor laser comprising:
   an n-type GaAs substrate having a lattice constant a;
   an n-type AlGaInP first cladding layer having a first lattice constant a;
   an undoped GaInP active layer having a second lattice constant;
   a p-type AlGaInP waveguide layer containing Zn as a dopant impurity and having a third lattice constant;
   a p-type AlGaInP second cladding layer containing Zn as a dopant impurity and having a fourth lattice constant;
   a p-type GaAs contacting layer, said layers being serially arranged physically and electrically; and
   a first electrode disposed on the substrate and a second electrode disposed on the contacting layer wherein the first, second, and fourth lattice constants are substantially equal to a and the ratio of the third lattice to a falls within a range of $2\times 10^{-3}$ to $1\times 10^{-2}$ when the third lattice constant is larger than a and a range of $5\times 10^{-3}$ to $2\times 10^{-2}$ when the third lattice constant is smaller than a, whereby Zn diffusion into the active layer is inhibited.

5. The semiconductor laser of claim 4 including a p-type GaInP etch stopping layer interposed between the waveguide and second cladding layers and containing Zn as a dopant impurity and having a lattice constant substantially equal to a.

6. A semiconductor laser comprising:
   an n-type GaAs substrate having a lattice constant a;
   an n-type AlGaInP first cladding layer having a first lattice constant;
   an undoped GaInP active layer having a second lattice constant;
   a p-type AlGaInP waveguide layer containing Zn as a dopant impurity and having a third lattice constant;
   a p-type AlGaInP second cladding layer containing Zn as a dopant impurity and having a fourth lattice constant;
   a p-type GaAs contacting layer, said layers being serially arranged physically and electrically; and
   a first electrode disposed on the substrate and a second electrode disposed on the contacting layer wherein the first and second lattice constants are substantially equal to a, the ratio of the fourth lattice to a falls within a range of $2\times 10^{-3}$ to $1\times 10^{-2}$ when the fourth lattice constant is larger than a and a range of $5\times 10^{-3}$ to $2\times 10^{-2}$ when the fourth lattice constant is smaller than a, and the third lattice constant is substantially equal to a at the active layer and increases substantially to the fourth lattice constant in the direction of and at the second cladding layer whereby Zn diffusion into the active layer is inhibited.

7. The semiconductor laser of claim 6 including a p-type GaInP etch stopping layer interposed between the waveguide and second cladding layers and containing Zn as a dopant impurity and having a lattice constant substantially equal to the fourth lattice constant.

* * * * *